(12) United States Patent　　　　(10) Patent No.:　　US 12,671,390 B2
Higuchi et al.　　　　　　　　　　　(45) Date of Patent:　　Jun. 30, 2026

(54) RESONATOR AND RESONANCE DEVICE

(71) Applicant: Murata Manufacturing Co., Ltd., Nagaokakyo (JP)

(72) Inventors: Yoshiyuki Higuchi, Nagaokakyo (JP); Ryota Kawai, Nagaokakyo (JP); Yoshihisa Inoue, Nagaokakyo (JP); Masakazu Fukumitsu, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 949 days.

(21) Appl. No.: 17/944,594

(22) Filed: Sep. 14, 2022

(65) Prior Publication Data

US 2023/0018209 A1　　Jan. 19, 2023

Related U.S. Application Data

(63) Continuation of application No. PCT/JP2020/042802, filed on Nov. 17, 2020.

(30) Foreign Application Priority Data

Apr. 22, 2020　(JP) ................................. 2020-076309

(51) Int. Cl.
　　*H03H 9/00*　　　(2006.01)
　　*H03H 9/02*　　　(2006.01)
　　　　　(Continued)

(52) U.S. Cl.
　　CPC .......... *H03H 9/17* (2013.01); *H03H 9/02228* (2013.01); *H03H 9/13* (2013.01)

(58) Field of Classification Search
　　CPC ........ H03H 9/17; H03H 9/02228; H03H 9/13; H03H 2009/02456; H03H 9/02157; H03H 9/1035; H03H 9/24
　　See application file for complete search history.

(56) References Cited

U.S. PATENT DOCUMENTS 10,673,402 B2　6/2020　Inoue et al.
2016/0072473 A1　3/2016　Nishimura et al.
　　　(Continued)

FOREIGN PATENT DOCUMENTS

CN　　　109075766 A　　12/2018
JP　　　2012105044 A　　5/2012
　　　(Continued)

OTHER PUBLICATIONS

International Search Report in PCT/JP2020/042802, mailed Feb. 2, 2021, 3 pages.

*Primary Examiner* — Julio C. Gonzalez

(74) *Attorney, Agent, or Firm* — ArentFox Schiff LLP

(57)　　　　　ABSTRACT

A vibration member is provided that includes a base with front and rear ends opposite to each other, and vibration arms fixed to the front end, extending away therefrom, and including at least one first vibration arm and a pair of second vibration arms positioned on both sides of a first vibration arm group including the at least one first vibration arm in a direction intersecting a longitudinal direction. A holding arm is provided that has one end connected to the base and the other end connected to a frame. A plurality of vibration portions include a piezoelectric film, and a lower electrode and an upper electrode that sandwich the piezoelectric film. A connection wiring line that connects the respective upper electrodes of the pair of second vibration arms to each other is provided in a region of at least either of the base or the holding arm.

12 Claims, 10 Drawing Sheets

(51) Int. Cl.
  *H03H 9/13*          (2006.01)
  *H03H 9/17*          (2006.01)

(56)                References Cited

U.S. PATENT DOCUMENTS

| | | | |
|---|---|---|---|
| 2018/0212139 A1 | 7/2018 | Hirota et al. | |
| 2019/0074812 A1* | 3/2019 | Inoue | B81B 3/0072 |
| 2019/0097600 A1* | 3/2019 | Yoshii | H03H 9/1057 |

FOREIGN PATENT DOCUMENTS

| | | | |
|---|---|---|---|
| JP | 2015035818 A | | 2/2015 |
| JP | 2015186019 A | | 10/2015 |
| JP | 6292229 B2 | | 3/2018 |
| JP | 2019165509 A | * | 9/2019 |
| WO | 2017064916 A1 | | 4/2017 |

* cited by examiner

RESONATOR AND RESONANCE DEVICE

CROSS REFERENCE TO RELATED APPLICATIONS

This application is a continuation of PCT Application No. PCT/JP2020/042802, filed Nov. 17, 2020, which claims priority to Japanese Patent Application No. 2020-076309, filed Apr. 22, 2020, the entire contents of each of which are hereby incorporated by reference in their entirety.

TECHNICAL FIELD

The present invention relates to a resonator and a resonance device.

BACKGROUND

Currently, resonators, such as a piezoelectric vibrators, are used as devices to achieve a clocking function in an electronic apparatus. With the reduction in size of electronic apparatuses, resonator are also demanded to be reduced in size, and resonators manufactured using Micro Electro Mechanical Systems (MEMS) technique (hereinafter, also referred to as "MEMS vibrator") have attracted attention.

For example, Japanese Patent No. 6292229 (hereinafter "Patent Document 1") describes a configuration of a vibrator having four vibration arms of which two vibration arms positioned on inner portions and two vibration arms positioned on outer portions flexurally vibrate in opposite phases.

However, in the related art, routing of a wiring line to control the phase of the flexural vibration in the plurality of vibration arms has not been considered.

SUMMARY OF THE INVENTION

Accordingly, it is an object of the present invention to provide a resonator and a resonance device configured to stabilize vibration characteristics by lowering electrical capacitance in a wiring line by simplifying the routing of the wiring line.

In an exemplary aspect, a resonator is provided that includes a vibration member, a frame, and a holding arm. The vibration member includes a base that has a front end and a rear end opposite to the front end, and a plurality of vibration arms that have fixed ends connected to the front end of the base, extend in a direction away from the front end, and include at least one first vibration arm and a pair of second vibration arms positioned on both sides of a first vibration arm group including the at least one first vibration arm in a direction intersecting a longitudinal direction. The frame is provided in at least part of a periphery of the vibration member, and the holding arm has one end connected to the base and the other end connected to the frame. A plurality of vibration portions include a piezoelectric film, and a lower electrode and an upper electrode provided to face each other sandwiching the piezoelectric film. A connection wiring line that connects the respective upper electrodes of the pair of second vibration arms to each other is provided in a region of at least either of the base or the holding arm.

According to the exemplary aspects of the present invention, the routing of a wiring line is simplified and thereby electrical capacitance in the wiring line is lowered and vibration characteristics are stabilized.

BRIEF DESCRIPTION OF DRAWINGS

FIG. 3 is a plan view of a resonator according to the first exemplary embodiment with an upper substrate removed.

FIG. 4 is a sectional view taken along line A-A' in FIG. 3.

DETAILED DESCRIPTION OF EMBODIMENTS

First Exemplary Embodiment

Figure 1:
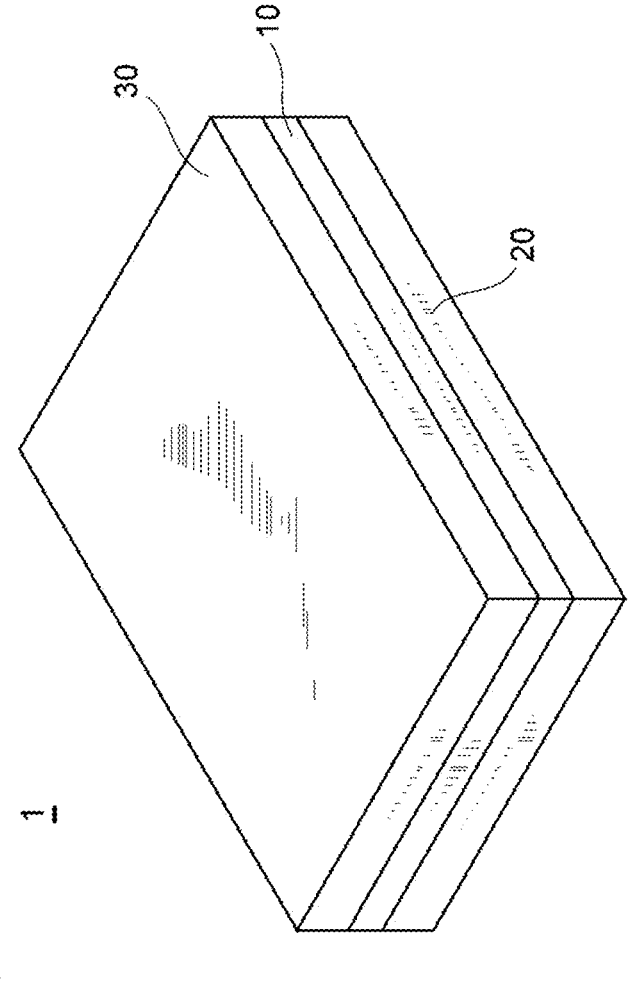
FIG. 1 is a perspective view of a resonance device according to a first exemplary embodiment.
Figure 2:
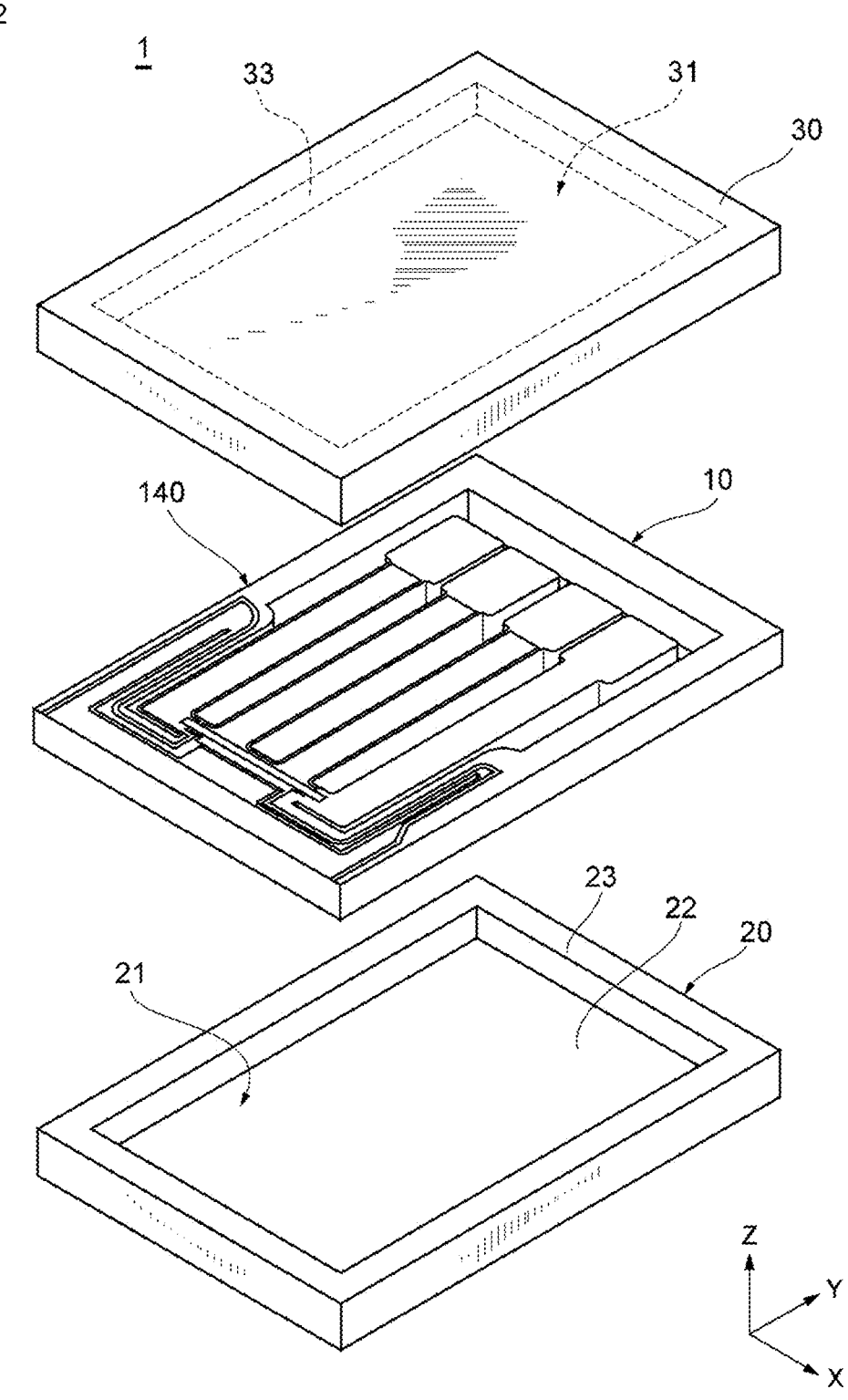
FIG. 2 is an exploded perspective view of the resonance device according to the first exemplary embodiment.

Hereinafter, a first exemplary embodiment will be described with reference to the accompanying drawings. FIG. 1 is a perspective view of a resonance device 1 according to the first exemplary embodiment schematically illustrating the appearance thereof. Further, FIG. 2 is an exploded perspective view of the resonance device 1 according to the first exemplary embodiment schematically illustrating a structure thereof.

As generally shown in FIG. 1, the resonance device 1 includes a resonator 10, an upper lid 30, and a lower lid 20. The upper lid 30 and the lower lid 20 are provided to face each other sandwiching the resonator 10. That is, the resonance device 1 is configured by stacking the lower lid 20, the resonator 10, and the upper lid 30 in this order.

Further, to seal the resonator 10, the resonator 10 and the lower lid 20 are joined, and the resonator 10 and the upper lid 30 are joined. With this configuration, a vibration space for the resonator 10 is formed. Each of the resonator 10, the lower lid 20, and the upper lid 30 is formed by using a Si substrate in an exemplary aspect. The Si substrates of the resonator 10, the lower lid 20, and the upper lid 30 are joined to each other. The resonator 10 and the lower lid 20 may be formed by using an SOI substrate in another exemplary aspect.

Moreover, the resonator 10 is a MEMS resonator manufactured by using a MEMS technique. Note that, in the present embodiment, described is an example in which the resonator 10 is formed by using a silicon substrate. Hereinafter, each component of the resonance device 1 will be described in detail.

Upper Lid 30

As shown in FIG. 2, the upper lid 30 extends in a flat plate shape along an XY plane, and a recessed portion 31 having a rectangular opening, for example, is formed on the back surface of the upper lid 30. The recessed portion 31 is surrounded by a side wall 33, and forms part of a vibration space in which the resonator 10 vibrates.

Lower Lid 20

Moreover, the lower lid 20 includes a bottom plate 22 having a rectangular flat plate shape provided along the XY plane, and a side wall 23 extending from a peripheral edge portion of the bottom plate 22 in a Z-axis direction (that is, a stacking direction of the lower lid 20 and the resonator 10). The lower lid 20 is provided with a recessed portion 21 formed by a surface of the bottom plate 22 and an inner surface of the side wall 23, on a surface facing the resonator 10. The recessed portion 21 forms part of the vibration space for the resonator 10. The vibration space is hermetically sealed with the upper lid 30 and the lower lid 20 described above, and is maintained in a vacuum state. The vibration space may be filled with a gas such as an inert gas, for example, in an exemplary aspect.

Resonator 10

Figure 3:
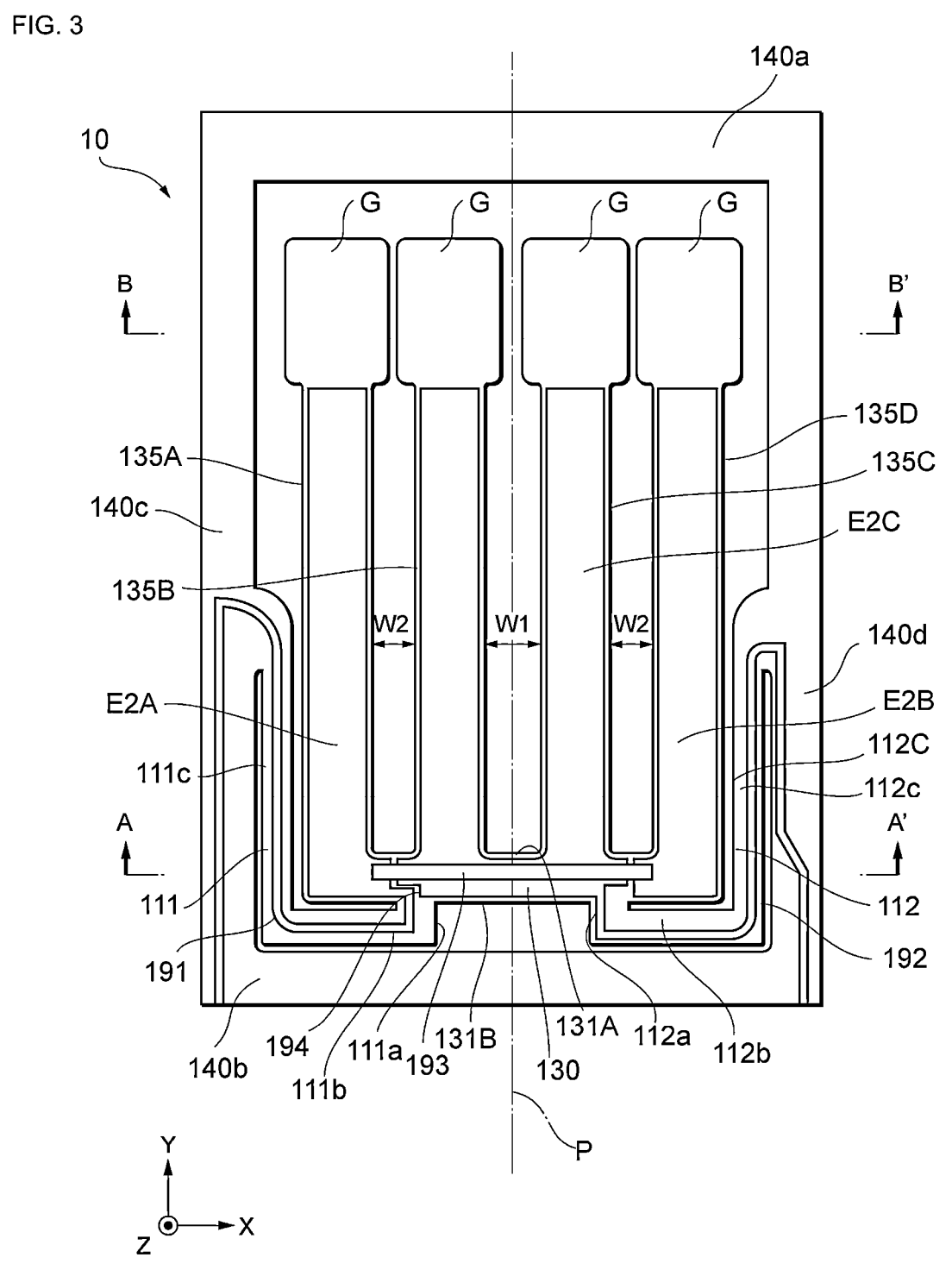

FIG. 3 is a plan view of the resonator 10 according to the present embodiment schematically illustrating a structure thereof. Each component of the resonator 10 according to the present embodiment will be described with reference to FIG. 3. As shown, the resonator 10 includes a vibration portion 120 (also referred to as a "vibrator"), a holding portion 140 (also referred to as a "frame"), holding arms 111 and 112, wiring lines 191 and 192, and a connection wiring line 193.

Vibration Portion 120

The vibration portion 120 (or vibrator) has a rectangular contour extending along the XY plane in the orthogonal coordinate system of FIG. 3. The vibration portion 120 is provided to an inner side portion of the holding portion 140, and spaces are formed at predetermined intervals between the vibration portion 120 and the holding portion 140. In the example in FIG. 3, the vibration portion 120 includes a base portion 130 (also referred to as a "base") and four vibration arms 135A to 135D (also collectively referred to as "vibration arms 135"). It should be appreciated that the number of vibration arms is not limited to four, and can be set to any number of three or more, for example. In the present embodiment, each of the vibration arms 135 and the base portion 130 are integrally formed.

The base portion 130 has a surface 131A at a front end in a Y-axis direction (hereinafter, also referred to as "front end 131A") and a surface 131B at a rear end in the Y-axis direction (hereinafter, also referred to as "rear end 131B"). The front end 131A and the rear end 131B are provided to oppose to each other.

The front end 131A of the base portion 130 is connected to the vibration arms 135. The rear end 131B of the base portion 130 is connected to the holding arms 111 and 112. It is also noted that the shape of the base portion 130 is substantially rectangular in a plan view in the example of FIG. 3, but is not limited to this configuration. It is sufficient that the base portion 130 is formed as substantially plane-symmetrical with a virtual plane P, determined along a perpendicular bisector of a long side 131a, as a center. In alternative exemplary aspects, the base portion 130 may have a trapezoidal shape in which a long side 131b is shorter than the long side 131a, or a semicircular shape in which the long side 131a is a diameter, for example. Further, the long sides 131a and 131b and short sides 131c and 131d are not limited to straight lines and may be curved lines.

The base portion 130 has a maximum length of approximately 40 μm between the front end 131A and the rear end 131B in the Y-axis direction, for example. Further, the base portion 130 has a maximum length of approximately 285 μm between side ends in an X-axis direction, for example. However, it is also noted that the sizes of the base portion 130 are examples, and are not limited to the numerical values described in the present embodiment. This also applies to sizes of other portions.

As further shown, the vibration arms 135 extend in the Y-axis direction and have the same size. The vibration arms 135 are provided in parallel to the Y-axis direction between the base portion 130 and the holding portion 140, and one ends thereof are connected to the front end 131A of the base portion 130 to be fixed ends, and the other ends thereof are open ends. Further, the vibration arms 135 are provided in parallel at predetermined intervals in the X-axis direction. Note that the vibration arm 135 has a width of approximately 50 μm in the X-axis direction, for example, and a length of approximately 420 μm in the Y-axis direction, for example.

In addition, the open end of the vibration arm 135 has a weight portion G in the exemplary aspect. The weight portion G (also referred to as a "weight") has a larger width in the X-axis direction relative to other portions of the vibration arm 135. The weight portion G has a width of approximately 70 μm in the X-axis direction, for example. Moreover, the weight portion G is integrally formed with the vibration arm 135 by the same process. With this configuration, the weight per unit length of the vibration arm 135 is heavier on the open end side than on the fixed end side. Accordingly, with the open end of the vibration arm 135 having the weight portion G, amplitude of the vibration arm 135 in an up-down direction may be increased.

In the X-axis direction, the two vibration arms 135A and 135D (e.g., referred to as "outer vibration arms") are disposed on outer portions of the vibration portion 120 of the present embodiment, and the two vibration arms 135B and 135C (e.g., referred to as "inner vibration arms") are disposed on inner portions thereof. An interval W1 between the vibration arms 135B and 135C in the X-axis direction is set to be larger than an interval W2 between the vibration arms 135A and 135B in the X-axis direction and an interval W2 between the vibration arms 135D and 135C in the X-axis direction. The outer vibration arms 135A and 135D (examples of the first vibration arm) are adjacent to the inner vibration arms 135B and 135C (examples of the second vibration arm). The interval W1 is approximately 30 μm, for example, and the interval W2 is approximately 25 μm, for example. By setting the interval W2 smaller than the interval W1, vibration characteristics are improved. Further, the interval W1 may be set to be smaller than the interval W2, or the interval W1 and the interval W2 may be set to the same interval so that the resonance device 1 may be reduced in size.

Holding Portion 140

The holding portion 140 (also referred to as a "frame") is formed in a rectangular frame shape along the XY plane. The holding portion 140 is provided to surround the outer side portion of the vibration portion 120 along the XY plane in a plan view thereof. It is noted that, it is sufficient that the holding portion 140 is provided to at least part of a periphery of the vibration portion 120, and the holding portion 140 is not limited to a frame shape in alternative aspects. For example, it is sufficient that the holding portion 140 holds the vibration portion 120 and is provided to the periphery of the vibration portion 120 to an extent that it joins the upper lid 30 to the lower lid 20.

In the present embodiment, the holding portion 140 is configured of prismatic frame bodies 140a to 140d that are integrally formed. As illustrated in FIG. 3, the frame body 140a faces the open ends of the vibration arms 135 and has a longitudinal direction along the X-axis. The frame body 140b faces the rear end 131B of the base portion 130 and has a longitudinal direction along the X-axis. The frame body 140c faces the side end (short side 131c) of the base portion 130 and the vibration arm 135A and has a longitudinal direction along the Y-axis. Both ends of the frame body 140*c* are connected to respective one ends of the frame bodies 140*a* and 140*b*. The frame body 140*d* faces the side end of the base portion 130 and the vibration arm 135D and has a longitudinal direction along the Y-axis. Both ends of the frame body 140*d* are connected to the respective other ends of the frame bodies 140*a* and 140*b*.

Holding Arms 111 and 112

The holding arms 111 and 112 are provided on the inner side portion of the holding portion 140, and connect the rear end 131B of the base portion 130 to the frame bodies 140*c* and 140*d*. As illustrated in FIG. 3, the holding arm 111 and the holding arm 112 are formed as substantially plane-symmetrical with a virtual plane P, determined in parallel to a YZ plane along a center line of the base portion 130 in the X-axis direction, as a center.

As further shown, the holding arm 111 has arms 111*a*, 111*b*, and 111*c*. One end of the holding arm 111 is connected to the rear end 131B of the base portion 130, and extends from there toward the frame body 140*b*. The holding arm 111 is bent in a direction toward the frame body 140*c* (that is, the X-axis direction), further is bent in a direction toward the frame body 140*a* (that is, the Y-axis direction), and is bent again in a direction toward the frame body 140*c* (that is, the X-axis direction). Thus, the other end of the holding arm 111 is connected to the frame body 140*c*.

One end of the arm 111*a* is connected to the rear end 131B of the base portion 130. The other end of the arm 111*a* is connected to one end of the arm 111*b* at a side surface of the other end of the arm 111*a*. According to an exemplary aspect, the arm 111*a* has a width of approximately 20 μm which is determined in the X-axis direction, and a length of approximately 40 μm which is determined in the Y-axis direction, for example.

The arm 111*b* is provided to have a longitudinal direction parallel to the X-axis direction. One end of the arm 111*b* is connected to a side surface, being the other end of the arm 111*a*, on a side facing the frame body 140*c*. The arm 111*b* extends from there to a direction substantially perpendicular to the arm 111*a*, that is, in the X-axis direction. Further, the other end of the arm 111*b* is connected to a side surface, being one end of the arm 111*c*, on a side facing the vibration portion 120. According to an exemplary aspect, the arm 111*b* has a width of approximately 20 μm which is determined in the Y-axis direction, and a length of approximately 75 μm which is determined in the X-axis direction, for example.

The arm 111*c* is provided to have a longitudinal direction parallel to the Y-axis direction. One end of the arm 111*c* is connected to the other end of the arm 111*b* at a side surface of the one end of the arm 111*c*, and the other end of the arm 111*c* is connected to the frame body 140*c*. The arm 111*c* has a width of approximately 20 μm which is determined in the X-axis direction, and a length of approximately 140 μm which is determined in the Y-axis direction, for example.

As described above, the holding arm 111 is configured as follows. The holding arm 111 is connected to the base portion 130 with the arm 111*a*, is bent at a connection portion of the arm 111*a* and the arm 111*b* and at a connection portion of the arm 111*b* and the arm 111*c*, and then is connected to the holding portion 140.

The holding arm 112 has arms 112*a*, 112*b*, and 112*c*. One end of the holding arm 112 is connected to the rear end 131B of the base portion 130, and the other end of the holding arm 112 is connected to the frame body 140*d*. The holding arm 112 extends from the rear end 131B of the base portion 130 toward the frame body 140*b*, and is bent in a direction toward the frame body 140*d* (that is, the X-axis direction).

Further, the holding arm 112 is bent in the direction toward the frame body 140*a* (that is, the Y-axis direction), and is bent again in the direction toward the frame body 140*d* (that is, the X-axis direction). Thus, the holding arm 112 is connected to the frame body 140*d*.

It is noted that, since the configurations of the arms 112*a*, 112*b*, and 112*c* are respectively symmetrical to those of the arms 111*a*, 111*b*, and 111*c*, a detailed description thereof will be omitted.

Wiring Lines 191 and 192

The wiring lines 191 and 192 are formed on a piezoelectric thin film F3 exposed on a surface of the resonator 10. The wiring lines 191 and 192 are wiring lines to connect a metal layer E2 formed on the piezoelectric thin film F3 of the resonator 10 to an AC power supply.

In the example illustrated in FIG. 3, the metal layer E2 includes a first region E2A, a second region E2B, and a third region E2C. The first region E2A extends from the tip end of the outer vibration arm 135A in the X-axis direction to the rear end 131B of the base portion 130, and is bent toward the inner vibration arm 135B adjacent to the vibration arm 135A. The second region E2B extends from the tip end of the outer vibration arm 135D in the X-axis direction to the rear end 131B of the base portion 130, and is bent toward the inner vibration arm 135C adjacent to the vibration arm 135D. Portions of the third region E2C extend from the respective tip ends of the inner vibration arms 135B and 135C adjacent to the vibration arms 135A and 135D to the rear end 131B of the base portion 130, and are connected to each other at the base portion 130. A clearance is formed between the first region E2A and the third region E2C, and a recessed portion 194 to route the wiring line 191 is formed in an end surface of the third region E2C adjacent to the first region E2A. Similarly, a clearance is formed between second region E2B and the third region E2C.

The wiring line 191 extends from the first region E2A of the metal layer E2 toward the frame body 140*d*, is bent from there toward the frame body 140*b*, and extends to the holding arm 111. Further, on the holding arm 111, the wiring line 191 extends to the frame body 140*c* along the holding arm 111, is bent at a connection portion of the holding arm 111 and the frame body 140*c*, extends toward the frame body 140*c*, and is drawn out to the outside of the resonator 10.

In addition, the wiring line 192 extends from the third region E2C of the metal layer E2 toward the frame body 140*b*, and extends to the holding arm 112. Further, on the holding arm 112, the wiring line 192 extends to the frame body 140*d* along the holding arm 112, is bent at a connection portion of the holding arm 112 and the frame body 140*d*, extends toward the frame body 140*b*, and is drawn out to the outside of the resonator 10.

Connection Wiring Line 193

The connection wiring line 193 connects the respective metal layers E2 of the outer vibration arms 135A and 135D in the X-axis direction to each other. In the example illustrated in FIG. 3, the connection wiring line 193 linearly connects the first region E2A and the second region E2B stretching over the third region E2C, in the base portion 130. In the case above, an insulation layer S is laminated in and on the metal layer E2 (i.e., in third region E2C) of the inner vibration arms 135B and 135C adjacent to the outer vibration arms 135A and 135D, and the connection wiring line 193 is provided on the laminated insulation layer S.

Lamination Structure

Figure 4:
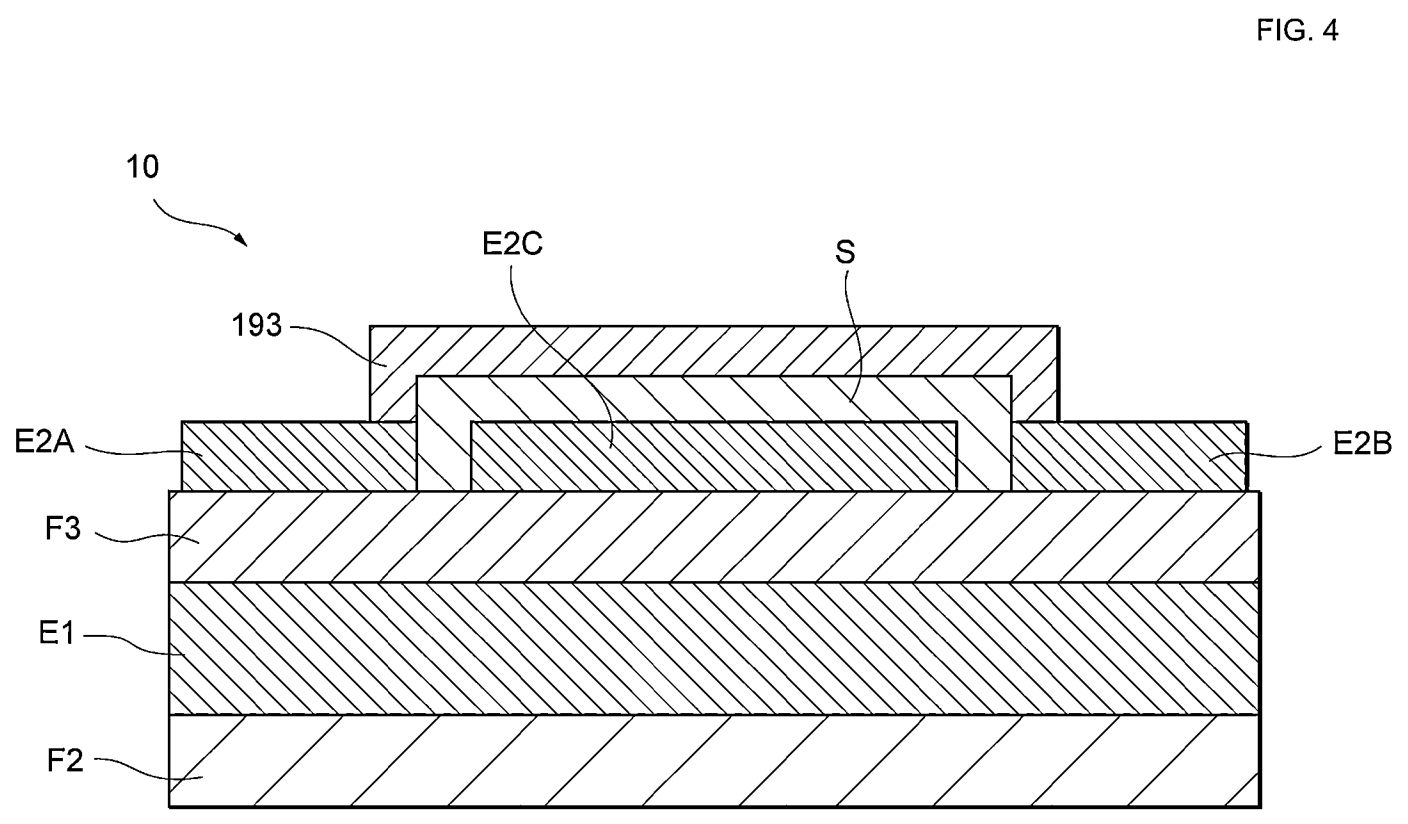

The lamination structure of the resonator 10 will be described with reference to FIG. 4. FIG. 4 is an outline diagram schematically illustrating a section taken along line A-A' in FIG. 3, and an electrical connection aspect of the resonator 10.

In the resonator 10, the holding portion 140, the base portion 130, the vibration arms 135, and the holding arms 111 and 112 are integrally formed in the same process. In the resonator 10, first, a metal layer E1 (an example of a second electrode) is laminated on a silicon (Si) substrate F2. Then, a piezoelectric thin film F3 (an example of a piezoelectric film) is laminated on the metal layer E1 to cover the metal layer E1. Further, the first region E2A, the second region E2B, and the third region E2C of the metal layer E2 (an example of a first electrode) are laminated on a surface (an example of an upper surface) of the piezoelectric thin film F3. It is noted that, by using a degenerate silicon substrate serving as a resistive body, the Si substrate F2 itself may serve as the metal layer E1. Thus, the metal layer E1 may be omitted. Further, an insulation layer S is laminated on a surface of the third region E2C of the metal layer E2. The connection wiring line 193 is laminated on a surface of the insulation layer S.

In an exemplary aspect, the Si substrate F2 is formed of a degenerate n-type Si semiconductor having a thickness of approximately 6 μm, for example, and may contain such as phosphorus (P), arsenic (As), or antimony (Sb) as an n-type dopant. A resistance value of the degenerate Si used for the Si substrate F2 is less than 1.6 mΩ·cm, for example, and more preferably 1.2 mΩ·cm or less. Further, a silicon oxide (SiO$_2$, for example) layer (temperature characteristics compensation layer) F21 is formed on a lower surface of the Si substrate F2. With this configuration, improvement of the temperature characteristics becomes possible.

The metal layers E1 and E2 are formed by using molybdenum (Mo) or aluminum (Al), for example, having a thickness of approximately 0.1 to 0.2 μm, for example. The metal layers E1 and E2 are formed into a desired shape by such as etching.

The metal layer E1 is formed to function as a lower electrode on the vibration portion 120, for example. Further, the metal layer E1 is formed to function, on the holding arms 111 and 112, and the holding portion 140, as a wiring line to connect the lower electrode to an AC power supply provided outside the resonator 10.

The metal layer E2 is formed to function as an upper electrode on the vibration portion 120. Further, the metal layer E2 is formed to function, on the holding arms 111 and 112, and the holding portion 140, as a wiring line to connect the upper electrode to a circuit provided outside the resonator 10.

Note that, to connect the AC power supply to a lower wiring line or an upper wiring line, the following configuration may be adopted. An electrode (an example of an outer electrode) is formed on an outer surface of the upper lid 30, and the electrode connects the circuit and the lower wiring line or the upper wiring line; or a via-hole is formed in the upper lid 30, the inside of the via-hole is filled with a conductive material to provide a wiring line, and the wiring line connects the AC power supply and the lower wiring line or the upper wiring line.

The insulation layer S is laid between the first region E2A and the third region E2C of the metal layer E2, and between the second region E2B and the third region E2C of the metal layer E2, and electrically insulates them from each other as specifically shown in FIG. 4.

As further shown, the connection wiring line 193 connects the first region E2A and the second region E2B of the metal layer E2. The connection wiring line 193 electrically connects the first region E2A and the second region E2B of the metal layer E2 in a state that the insulation is ensured between the first region E2A and the third region E2C of the metal layer E2, and between the second region E2B and the third region E2C of the metal layer E2.

In general, the piezoelectric thin film F3 is a piezoelectric film that converts an applied voltage into vibration, and may have nitride such as aluminum nitride (AlN) or oxide as a main component, for example. In particular, the piezoelectric thin film F3 may be formed of scandium aluminum nitride (ScAlN). ScAlN is aluminum nitride in which part of aluminum is replaced by scandium. Further, the piezoelectric thin film F3 has a thickness of 1 μm, for example, but may have the thickness of approximately 0.2 μm to 2 μm in exemplary aspects.

In operation, the piezoelectric thin film F3 expands and contracts in an in-plane direction of the XY plane, that is, the Y-axis direction in accordance with an electric field applied to the piezoelectric thin film F3 through the metal layers E1 and E2. The expansion and contraction of the piezoelectric thin film F3 make the vibration arms 135 displace their open ends toward inner surfaces of the lower lid 20 and the upper lid 30, and the vibration arms 135 vibrate in an out-of-plane flexural vibration mode.

Function of Resonator

The function of the resonator 10 will be described with reference to FIG. 5. In the present embodiment, the phase of an electric field applied to the outer vibration arms 135A and 135D and the phase of an electric field applied to the inner vibration arms 135B and 135C are set to be opposite to each other. With this configuration, the outer vibration arms 135A and 135D and the inner vibration arms 135B and 135C displace in directions opposite to each other. For example, when the open ends of the outer vibration arms 135A and 135D displace toward the inner surface of the upper lid 30, the open ends of the inner vibration arms 135B and 135C displace toward the inner surface of the lower lid 20.

Figure 5:
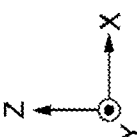
FIG. 5 is a sectional view taken along line B-B' in FIG. 3.

As a result, in the resonator 10 according to the present embodiment, at the time of vibration in opposite phases, that is, the vibration arm 135A and the vibration arm 135B vibrate in opposite up-down directions around a central axis r1 extending in parallel to the Y-axis between the vibration arm 135A and the vibration arm 135B illustrated in FIG. 5. Further, the vibration arm 135C and the vibration arm 135D vibrate in opposite up-down directions around a central axis r2 extending in parallel to the Y-axis between the vibration arm 135C and the vibration arm 135D. As a result, torsional moments in directions opposite to each other are generated at the central axes r1 and r2, and flexural vibration is generated at the base portion 130.

In the resonator 10 according to the present embodiment, the respective metal layers E2 of the outer vibration arms 135A and 135D are connected to each other by the connection wiring line 193 in the base portion 130 as described above. For this reason, the wiring distance of the connection wiring line 193 is shortened in comparison with a case that a connection wiring line to connect the outer vibration arms 135A and 135D to each other is detoured and routed in such as the holding portion 140, for example. Thus, the parasitic capacitance of the connection wiring line 193 is suppressed. With this configuration, oscillation with an oscillation circuit of the resonator 10 may be stabilized. Further, shortening the wiring distance of the connection wiring line 193 contributes to the reduction of the resonator 10 in size.

Second Exemplary Embodiment

In the second and subsequent embodiments, a description of features common to the first embodiment will be omitted, and only differences will be described. In particular, similar functions and effects because of similar configurations will not be described one by one for each embodiment.

Figure 6:
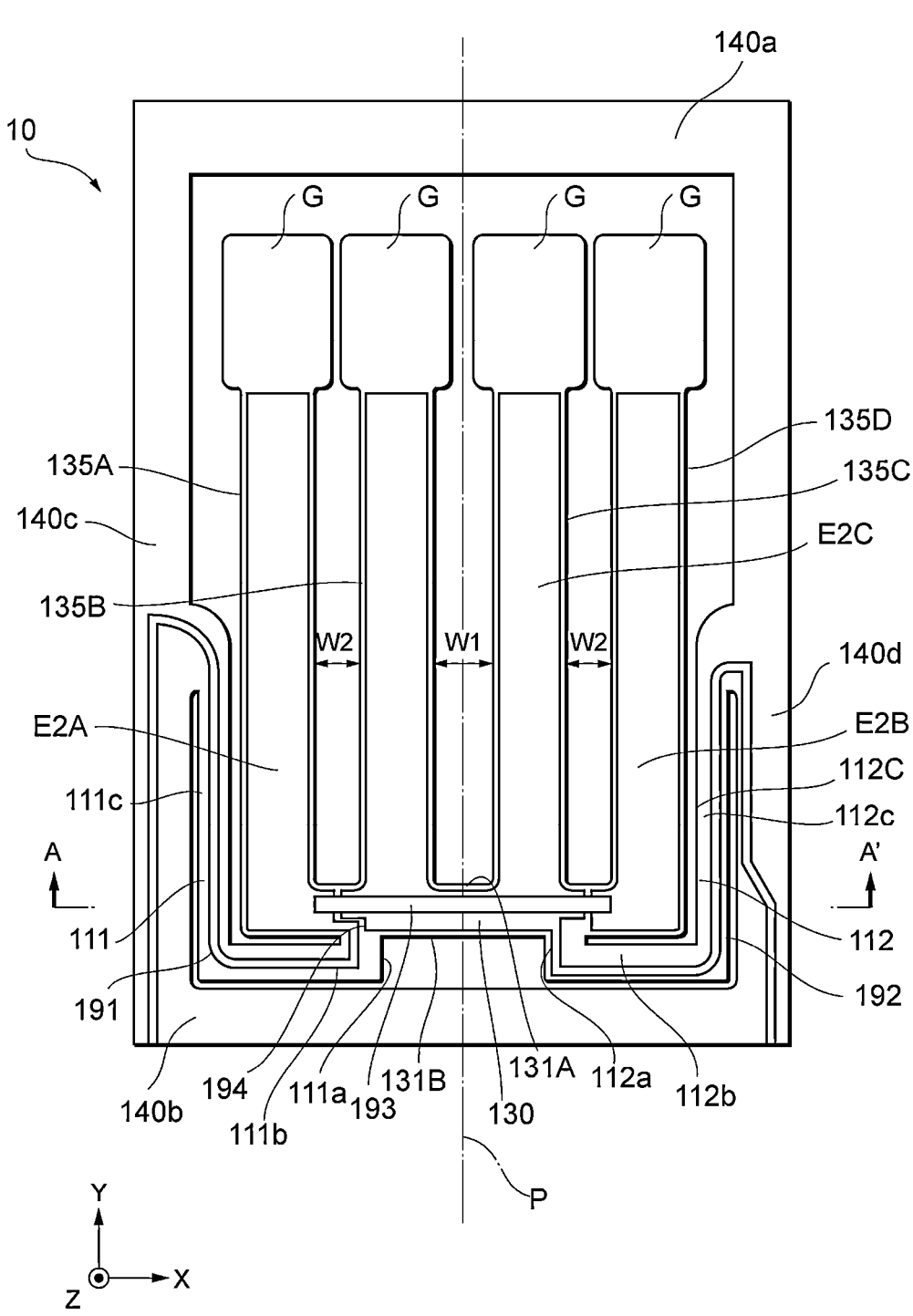
FIG. 6 is a plan view of a resonator according to a second exemplary embodiment with an upper substrate removed.

FIG. 6 is a plan view of a resonator 10 according to the present embodiment schematically illustrating an example of a structure thereof. Hereinafter, in a detailed configuration of the resonator 10 according to the present embodiment, differences from the first embodiment will mainly be described. The resonator 10 according to the present embodiment has the commonality with the connection wiring line 193 described in the first embodiment in that the respective metal layers E2 of the outer vibration arms 135A and 135D are connected to each other by the connection wiring line 193 in the base portion 130. However, the resonator 10 according to the present embodiment is different from that of the first embodiment in a peripheral configuration of the connection wiring line 193.

Figure 7:
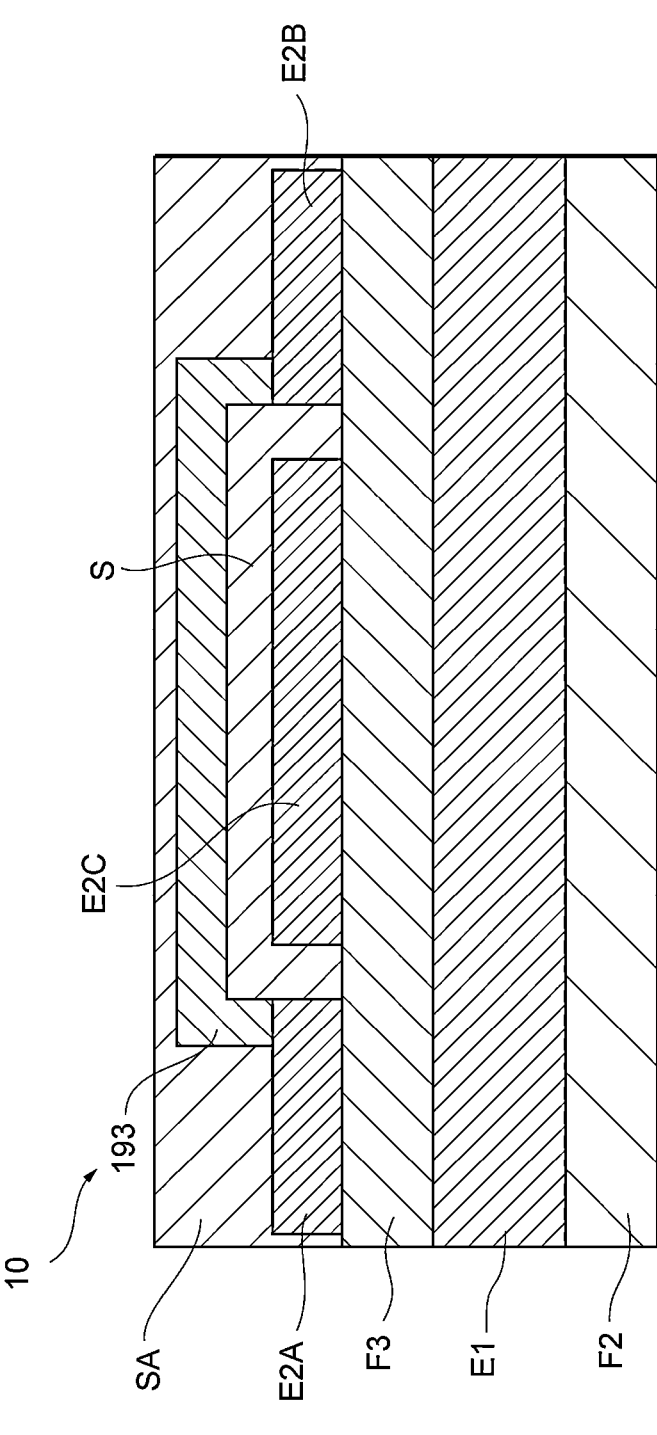
FIG. 7 is a sectional view taken along line A-A' in FIG. 6.

Specifically, as illustrated in FIG. 7, in the resonator 10 according to the present embodiment, an insulation layer SA is laminated on a surface of the connection wiring line 193. The insulation layer SA suppresses exposure of the surface of the connection wiring line 193 to the outside. It is noted that, in the plan view of FIG. 6, the insulation layer SA of FIG. 7 is omitted for convenience of explanation.

In the resonator 10 according to the present embodiment, since the insulation layer SA is laminated on the surface of the connection wiring line 193, adhering of foreign substances to the connection wiring line 193 is unlikely to occur. Thus, the occurrence of an electrical short circuit (e.g., a short) in the connection wiring line 193 may be suppressed.

Third Exemplary Embodiment

Figure 8:
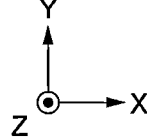
FIG. 8 is a plan view of a resonator according to a third exemplary embodiment with an upper substrate removed.

FIG. 8 is a plan view of a resonator 10 according to the present embodiment schematically illustrating an example of a structure thereof. Hereinafter, in a detailed configuration of the resonator 10 according to the present embodiment, differences from the first embodiment will mainly be described. The resonator 10 according to the present embodiment is different from that of the first embodiment in the peripheral configuration of the connection wiring line 193 described in the first embodiment.

Holding Arm 113

In the present embodiment, one end of the holding arm 113 is connected to the frame body 140*c* and extends from there toward the frame body 140*b*. The holding arm 113 is bent in the direction toward the frame body 140*d* (X-axis direction) and extends, and is bent from there in the direction toward the frame body 140*a* (Y-axis direction). Then, the other end of the holding arm 113 is connected to the frame body 140*d*. At a portion extending in the X-axis direction, the holding arm 113 is connected to the rear end 131B of the base portion 130 via one connection portion 195.

Wiring Lines 191, 191A, and 192

In the example illustrated in FIG. 8, the wiring line 191 extends from the first region E2A of the metal layer E2 toward the frame body 140*d*, is bent from there toward the frame body 140*b*, and extends to the holding arm 113 passing through the connection portion 195. Further, on the holding arm 113, the wiring line 191 extends to the frame body 140*c* along the holding arm 113, is bent at a connection portion of the holding arm 113 and the frame body 140*c*, extends toward the frame body 140*b*, and is drawn out to the outside of the resonator 10.

Moreover, a wiring line 191A extends from the second region E2B of the metal layer E2 toward the frame body

140*c*, is bent from there toward the frame body 140*b*, and extends to the holding arm 113 passing through the connection portion 195.

In addition, the wiring line 192 extends from the third region E2C of the metal layer E2 toward the frame body 140*c*, is bent toward the frame body 140*b* from there, and extends to the holding arm 113 passing through the connection portion 195. Further, on the holding arm 113, the wiring line 192 extends to the frame body 140*d* along the holding arm 113, is bent at the connection portion of the holding arm 113 and the frame body 140*d*, extends toward the frame body 140*b*, and is drawn out to the outside of the resonator 10.

Connection Wiring Line 193

A connection wiring line 193 connects the wiring lines 191 and 191A, extending from the respective metal layers E2 of the outer vibration arms 135A and 135D in the X-axis direction, to each other. In the example illustrated in FIG. 8, the connection wiring line 193 linearly connects the wiring line 191 and the wiring line 191A stretching over the wiring line 192, in the holding arm 113. In the case above, an insulation layer is laminated on the wiring line 192, and the connection wiring line 193 is provided on the laminated insulation layer.

In the resonator 10 according to the present embodiment, the connection wiring line 193 to connect the respective metal layers E2 of the outer vibration arms 135A and 135D is provided on the holding arm 113. With this configuration, since the connection wiring line 193 is provided at a position where the amplitude is small, the vibration characteristics of the resonator 10 can be stabilized.

Fourth Exemplary Embodiment

Figure 9:
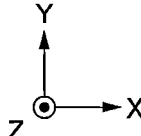
FIG. 9 is a plan view of a resonator according to a fourth exemplary embodiment with an upper substrate removed.

FIG. 9 is a plan view of a resonator 10 according to the present embodiment schematically illustrating an example of a structure thereof. Hereinafter, in a detailed configuration of the resonator 10 according to the present embodiment, differences from the first embodiment will mainly be described. The resonator 10 according to the present embodiment is different from that of the first embodiment in the peripheral configuration of the connection wiring line 193 described in the first embodiment.

Holding Arm 113

In the present embodiment, one end of the holding arm 113 is connected to the frame body 140*c* and extends from there toward the frame body 140*b*. The holding arm 113 is bent in the direction toward the frame body 140*d* (e.g., in the X-axis direction) and extends, and is bent from there in the direction toward the frame body 140*a* (e.g., in the Y-axis direction). Then, the other end of the holding arm 113 is connected to the frame body 140*d*. At a portion extending in the X-axis direction, the holding arm 113 is connected to the rear end 131B of the base portion 130 via two connection portions 195A and 195B.

Wiring Lines 191, 191A, and 192

In the example illustrated in FIG. 9, the wiring line 191 extends from the first region E2A of the metal layer E2 toward the frame body 140*d*, is bent from there toward the frame body 140*b*, and extends to the holding arm 113 passing through the connection portion 195A. Further, on the holding arm 113, the wiring line 191 extends to the frame body 140*c* along the holding arm 113, is bent at the connection portion of the holding arm 113 and the frame body 140*c*, extends toward the frame body 140*b*, and is drawn out to the outside of the resonator 10.

A wiring line 191A extends from the second region E2B of the metal layer E2 toward the frame body 140c, is bend from there toward the frame body 140b, and extends to the holding arm 113 passing through the connection portion 195B.

Moreover, the wiring line 192 extends from the third region E2C of the metal layer E2 toward the frame body 140c, is bent from there toward the frame body 140b, and extends to the holding arm 113 passing through the connection portion 195B. Further, on the holding arm 113, the wiring line 192 extends to the frame body 140d along the holding arm 113, is bent at the connection portion of the holding arm 113 and the frame body 140d, extends toward the frame body 140b, and is drawn out to the outside of the resonator 10.

Connection Wiring Line 193

A connection wiring line 193 connects the wiring lines 191 and 191A, extending from the respective metal layers E2 of the outer vibration arms 135A and 135D in the X-axis direction, to each other. In the example illustrated in FIG. 9, the connection wiring line 193 linearly connects the wiring line 191 and the wiring line 191A stretching over the wiring line 192, in the holding arm 113. In the case above, an insulation layer is laminated on the wiring line 192, and the connection wiring line 193 is provided on the laminated insulation layer. Further, the connection wiring line 193 is provided at a position adjacent to the two connection portions 195A and 195B. As shown, the position adjacent to the two connection portions 195A and 195B is the position, in a portion of the holding arm 113 extending in the X-axis direction, on a side of the base portion 130 relative to a center position in the Y-axis direction, for example.

In the resonator 10 according to the present embodiment, the connection wiring line 193 is provided at a position adjacent to the two connection portions 195A and 195B. With this configuration, the strength of the connection portions 195A and 195B to connect the base portion 130 and the holding arm 113 may be increased.

Fifth Exemplary Embodiment

Figure 10:
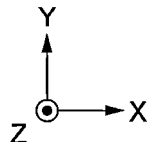
FIG. 10 is a plan view of a resonator according to a fifth exemplary embodiment with an upper substrate removed.

FIG. 10 is a plan view of a resonator 10 according to the present embodiment schematically illustrating an example of a structure thereof. Hereinafter, in a detailed configuration of the resonator 10 according to the present embodiment, differences from the first embodiment will mainly be described. The resonator 10 according to the present embodiment is different from that of the first embodiment in the peripheral configuration of the connection wiring line 193 described in the first embodiment.

Holding Arm 113

In the present embodiment, one end of the holding arm 113 is connected to the frame body 140c and extends from there toward the frame body 140b. The holding arm 113 is bent in the direction toward the frame body 140d (e.g., in the X-axis direction) and extends, and is bent from there in the direction toward the frame body 140a (e.g., in the Y-axis direction). Then, the other end of the holding arm 113 is connected to the frame body 140d. At a portion extending in the X-axis direction, the holding arm 113 is connected to the rear end 131B of the base portion 130 via three connection portions 195A, 195B, and 195C.

Wiring Lines 191, 191A, and 192

In the example illustrated in FIG. 10, the wiring line 191 extends from the first region E2A of the metal layer E2 toward the frame body 140d, is bent from there toward the frame body 140b, and extends to the holding arm 113 passing through the connection portion 195A. Further, on the holding arm 113, the wiring line 191 extends to the frame body 140c along the holding arm 113, is bent at the connection portion of the holding arm 113 and the frame body 140c, extends toward the frame body 140b, and is drawn out to the outside of the resonator 10.

As further shown, the wiring line 191A extends from the second region E2B of the metal layer E2 toward the frame body 140c, is bent from there toward the frame body 140b, and extends to the holding arm 113 passing through the connection portion 195C.

The wiring line 192 extends from the third region E2C of the metal layer E2 toward the frame body 140c, is bent from there toward the frame body 140b, and extends to the holding arm 113 passing through the connection portion 195B. Further, on the holding arm 113, the wiring line 192 extends to the frame body 140d along the holding arm 113, is bent at the connection portion of the holding arm 113 and the frame body 140d, extends toward the frame body 140b, and is drawn out to the outside of the resonator 10.

Connection Wiring Line 193

A connection wiring line 193 connects the wiring lines 191 and 191A, extending from the respective metal layers E2 of the outer vibration arms 135A and 135D in the X-axis direction, to each other. In the example illustrated in FIG. 10, the connection wiring line 193 linearly connects the wiring line 191 and the wiring line 191A stretching over the wiring line 192, in the holding arm 113. In the case above, an insulation layer is laminated on the wiring line 192 in a similar configuration as described above, and the connection wiring line 193 is provided on the laminated insulation layer. Further, the connection wiring line 193 is provided at a position adjacent to the three connection portions 195A, 195B, and 195C. The position adjacent to the three or more connection portions 195A, 195B and 195C is the position, in a portion of the holding arm 113 extending in the X-axis direction, on a side of the base portion 130 relative to a center position in the Y-axis direction, for example.

In the resonator 10 according to the present embodiment, the connection wiring line 193 is provided at a position adjacent to the three connection portions 195A, 195B, and 195C. With this configuration, the strength of the connection portions 195A, 195B, and 195C to connect the base portion 130 and the holding arm 113 may be increased.

Further, the resonance device 1 according to the present embodiment includes the resonator 10 described above, the upper lid 30 and the lower lid 20 provided to face each other sandwiching the resonator 10, and an outer electrode. Since the resonance device 1 according to the present embodiment suppresses the electrification of a protection film 235 formed on the vibration portion 120 with an electric charge, the variation of a resonant frequency due to the electric charge in the electrified vibration portion 120 can be prevented.

Hereinafter, exemplary embodiments of the present invention will be described as supplementary notes, and effects thereof will be described. However, it should be appreciated that the present invention is not limited to the following supplementary notes.

According to an exemplary aspect, a resonator is provided that includes a vibration member, a frame, and a holding arm. The vibration member includes a base that has a front end and a rear end opposite to the front end, and a plurality of vibration arms that have fixed ends connected to the front end of the base portion, extend in a direction away from the front end, and include at least one first vibration arm and a pair of second vibration arms positioned on both sides of a first vibration arm group including the at least one first vibration arm in a direction intersecting a longitudinal direction. The frame is provided in at least part of a periphery of the vibration member, and the holding arm has one end connected to the base and the other end connected to the frame. A plurality of vibration portions include a piezoelectric film, and a lower electrode and an upper electrode provided to face each other sandwiching the piezoelectric film. A connection wiring line that connects the respective upper electrodes of the pair of second vibration arms to each other is provided in a region of at least either of the base or the holding arm.

As an exemplary aspect, the resonator is configured in which an insulation layer is laminated in and on the upper electrode in the at least one first vibration arm, and the connection wiring line is provided on the laminated insulation layer.

As an exemplary aspect, the resonator is configured in which the holding arm includes two connection portions connected to the base, and the connection wiring line is provided at a position overlapping the two connection portions in a direction intersecting a longitudinal direction of the plurality of vibration arms.

As an exemplary, the resonator is configured in which the holding arm includes three or more connection portions connected to the base, and the connection wiring line is provided at a position overlapping the three or more connection portions in a direction intersecting a longitudinal direction of the plurality of vibration arms.

As an exemplary aspect, a resonance device is provided that includes any of the resonators described above, an upper lid and a lower lid provided to face each other sandwiching the resonator, and an outer electrode that applies a voltage to a pair of electrodes.

As described above, according to an exemplary aspect, the routing of a wiring line is simplified, and thus the electrical capacitance in the wiring line is lowered and the vibration characteristics are stabilized.

The embodiments described above are intended to facilitate understanding of the present invention, and are not intended to limit the present invention. Thus, it should be appreciated that the present invention can be changed/improved without departing from the gist thereof, and the present invention includes equivalents thereof. That is, products achieved by design change on the aforementioned embodiments carried out appropriately by those skilled in the art, are also included in the scope of the present invention as long as the products include the features of the present invention. For example, elements included in each embodiment and their arrangement, materials, conditions, shapes, sizes and the like are not limited to those illustrated and may be changed as appropriate. Further, elements included in each embodiment can be combined as long as it is technically possible, and a combination thereof is also included in the scope of the present invention as long as the combination includes the features of the present invention.

REFERENCE SIGNS LIST

10 RESONATOR
30 UPPER LID
20 LOWER LID
140 HOLDING PORTION
140*a* to 140*d* FRAME BODY
111, 112, 113 HOLDING ARM
120 VIBRATION PORTION
130 BASE PORTION
135A to 135D VIBRATION ARM

F2 Si SUBSTRATE
191, 191A, 192 WIRING LINE
193 CONNECTION WIRING LINE

The invention claimed is:

1. A resonator, comprising:

a vibration member that includes a base having a front end and a rear end that oppose each other and a plurality of vibration arms that extend from the front end of the base and include at least one first vibration arm and a pair of second vibration arms disposed on both sides of the at least one first vibration arm;

a frame disposed in at least part of a periphery of the vibration member; and a holding arm having a first end connected to the base and a second end connected to the frame, wherein the plurality of vibration arms each include a piezoelectric film, and a lower electrode and an upper electrode that face each other sandwiching the piezoelectric film, wherein the upper electrode comprises a metal layer having a first region that extends from a tip end of a first arm of the pair of second vibration arms, a second region that extends from a tip end of a second arm of the pair of second vibration arms, and a third region that extends from a tip end of the at least one first vibration arm, wherein the plurality of vibration arms, the base, and the holding arm each have a movable region configured to vibrate in a predetermined vibration mode, wherein a connection wiring line connects the first region of the metal layer to the second region of the metal layer, with the connection wiring line disposed in the movable region of at least one of the base and the holding arm, and wherein an insulation layer is disposed on the third region of the metal layer to electrically insulate the third region from each of the first and second regions of the metal layer.

2. The resonator according to claim 1, wherein the connection wiring line is disposed on the insulation layer that is laminated on the upper electrode of the at least one first vibration arm.

3. The resonator according to claim 1, wherein the holding arm includes two connection portions that are connected to the base, and wherein the connection wiring line is disposed at a position adjacent to the two connection portions.

4. The resonator according to claim 1, wherein the holding arm includes three or more connection portions connected to the base, and wherein the connection wiring line is disposed at a position adjacent to the three or more connection portions.

5. The resonator according to claim 1, wherein a first clearance is disposed between the first region and the third region and a second clearance is disposed between the second region and the third region.

6. The resonator according to claim 5, wherein a recess is provided in an end surface of the third region to route a wiring line from a frame to at least the first region.

7. The resonator according to claim 1, wherein the insulation layer is sandwiched between the connection wiring line and the third region of the metal layer.

8. A resonance device comprising:

the resonator according to claim 1;

an upper lid and a lower lid disposed to face each other and sandwich the resonator; and an outer electrode configured to apply a voltage to the upper and lower electrodes.

9. The resonator according to claim 1, wherein the connection wiring line extends in a lengthwise direction of the base of the vibration member and overlaps the vibration member in a plan view thereof.

10. A resonator, comprising:

a vibration member that includes a base and a plurality of vibration arms that extend in parallel from a side of the base, with plurality of vibration arms including at least one inner vibration arm and a pair of outer vibration arms disposed on respective sides of the at least one inner vibration arm;

a frame disposed around at least part of a periphery of the vibration member;

a connection wiring line; and a holding arm that connects the base to the frame, wherein the plurality of vibration arms each include a piezoelectric film, and lower and upper electrodes that sandwich the piezoelectric film, wherein the plurality of vibration arms, the base, and the holding arm each have a movable region configured to vibrate in a predetermined vibration mode, wherein the upper electrode comprises a metal layer having a first region that extends from a tip end of a first outer arm of the pair of outer vibration arms, a second region that extends from a tip end of a second outer arm of the pair of outer vibration arms, and a third region that extends from a tip end of the at least one inner vibration arm, wherein the connection wiring line connects the first region of the metal layer to the second region of the metal layer, with the connection wiring line disposed in the movable region of at least one of the base and the holding arm, and wherein an insulation layer is disposed on the third region of the metal layer to electrically insulate the third region from each of the first and second regions of the metal layer.

11. The resonator according to claim 10, wherein the insulation layer is sandwiched between the connection wiring line and the third region of the metal layer.

12. The resonator according to claim 10, wherein the connection wiring line extends in a lengthwise direction of the base of the vibration member and overlaps the vibration member in a plan view thereof.

* * * * *